United States Patent
Pascucci (12)

(10) Patent No.: US 6,330,188 B1
(45) Date of Patent: Dec. 11, 2001

(54) DATA READ CIRCUIT FOR NON VOLATILE MEMORY CELLS

(75) Inventor: Luigi Pascucci, Sesto S. Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/413,383

(22) Filed: Oct. 6, 1999

(30) Foreign Application Priority Data

Oct. 6, 1998 (IT) ............................................. TO98A0839

(51) Int. Cl.$^7$ .................................................. G11C 16/06
(52) U.S. Cl. ................................... 365/185.2; 365/185.21
(58) Field of Search .......................... 365/185.2, 185.21, 365/185.22, 210

(56) References Cited

U.S. PATENT DOCUMENTS

| | | | |
|---|---|---|---|
| 5,773,997 | * | 6/1998 | Stiegler ................................. 365/208 |
| 5,864,513 | * | 1/1999 | Pascucci ................................ 365/210 |
| 5,886,925 | * | 3/1999 | Campardo ........................... 365/185.2 |
| 6,128,225 | * | 10/2000 | Campardo ......................... 365/185.21 |

* cited by examiner

*Primary Examiner*—A. Zarabian
(74) *Attorney, Agent, or Firm*—Lisa K. Jorgenson; Stephen Bongini; Fleit, Kain, Gibbons, Gutman & Bongini P.L.

(57) ABSTRACT

A data read circuit for non volatile memory cells, organized in arrays, which provides an array branch comprising a bitline leading to a read cell apt to supply a cell current, a bias circuit for said bitline, a load circuit wherein is flowing an array current and which has, additionally, a reference branch including a bitline leading to a reference cell, which is apt to provide a virgin cell current, a bias circuit of said bitline, a load circuit wherein is flowing a reference current, means for unbalancing the array current with respect to the reference current. According to the present invention said means for means (M14', M24, M24', M34, M34', M37, M37', M44, M44', M47, M47') the array current (Im) with respect to the reference current (Ir) pick up an additional fraction of current (kIc) of the array current (Im) from the supply (VDD) and inject said additional fraction of current (kIc) in the reference branch.

18 Claims, 5 Drawing Sheets

DATA READ CIRCUIT FOR NON VOLATILE MEMORY CELLS

FIELD OF THE INVENTION

The present invention relates to data read circuit for non volatile memory cells, organized in arrays, which provides an array branch comprising a bitline leading to a read cell apt to supply a cell current, a bias circuit for said bitline, a load circuit wherein is flowing an array current and which has, additionally, a reference branch including a bitline leading to a reference cell, which is apt to provide a virgin cell current, a bias circuit of said bitline, a load circuit wherein is flowing a reference current, means for unbalancing the array current with respect to the reference current.

BACKGROUND OF THE INVENTION

Reference herein will be made to conventional terms applying to MOS (Metal Oxide Semiconductor) transistors technology. In particular, the word 'gate' means the control or input electrode or control port of the MOS transistor, whereas 'drain' means the load or output electrode and 'source' the source or output electrode.

Non volatile memories are memories that do not loose their stored data when the circuit is no longer supplied. This kind of memories includes the following socalled ROM (Read Only Memory), EPROM (Erasable Programmable Read Only Memory), EEPROM (Electrically Erasable Programmable Read Only Memory), EAROM (Electrically Alterable Read Only Memory).

In EEPROM memories, in particular, the data to be stored is substantially stored inside a MOS transistor. Said MOS transistor has two gate electrodes, i.e. a control gate electrically connected to the circuit where the gate voltage is applied to, the other a so called floating gate separated by an SiO2 oxide barrier from the control gate, wherein it is buried. According to the logic status to be stored through application of proper voltages, an either positive or negative charge is trapped inside the floating gate. Said charge goes by tunnel effect from the substrate to the floating gate through the potential oxide barrier, where it remains trapped. The trapped charge influences the voltage-current feature of the transistor, with a consequent shift of the transistor threshold voltage according to the type of charge being trapped inside the floating gate. The cell consisting of the transistor may then take three different statuses, i.e. it can be written, cancelled or virgin, as to whether the floating gate contains either one or the other charge type or was never charged. Association between the logic status, the sign of the trapped charge and the programmation status of the cell, either written or cancelled, will be a matter of choice of most proper conventions and may change from product to product.

The logic status contained in the cell can be identified by detecting the current flowing through it under common bias conditions. In fact, if negative charges are trapped inside the floating gate, the transistor threshold voltage is higher compared to that of a virgin transistor, so for a same determined drain-source voltage the current will be lower. Viceversa, if positive charges are trapped in the floating gate, the threshold voltage will decrease compared to a virgin transistor and the current be higher.

A logical status is in fact detected by comparing a cell current with the current of a virgin cell under the same bias conditions. Such a comparison is made through a 'sense amplifier' or read amplifier.

Several circuit techniques are available, which tend to the construction of a reference circuit for the sense amplifier to safely devise between the current associated to a virgin cell and the current associated to a programmed cell.

FIG. 1 shows a circuit diagram of a read circuit for memory cells 1 in a non volatile memory according to the known state of the art. Said read circuit of memory cells 1 consists of two substantially symmetric branches, i.e. a left branch 2 and a right branch 2'. The left branch 2 comprises a left array of memory cells 3, a selection circuit of the memory cells 4 operating on a bitline BL, a bias circuit 5, a load circuit 6, whereas the right branch 2' comprises a right array of memory cells 3', a selection circuit of the memory cells 4' operating on a bitline BL', a bias circuit 5', a load circuit 6'.

Both the load circuit 6 and load circuit 6' consist of their relevant MOS p-channel transistors M1 and M1', which are joined together in a current-mirror or current repeater configuration, while input terminals IN and IN' of a differential amplifier not shown here are connected to their drain nodes, which are defined as nodes D and D', respectively.

The bias circuit 5 is used to set a fixed voltage value during read operation, which essentially consists of an n-channel pass transistor M2, whose control electrode or 'gate' is driven by an inverter circuit, obtained in this case through a NOR logical gate 7 having one input connected to the bitline BL. The other input of the logical gate 7 will receive an enable signal EN. The bias circuit 5 is usually called a "cascode circuit".

The selection circuit of memory cells 4 is a transistors circuit receiving at its input the address signals for selecting the memory cells to be read contained in the left array of memory cells 3. Operation of the circuits pertaining to the right branch 3' are not further described here, as it is analogous.

The left array of memory cells 3 and the right array of memory cells 3' usually contain reference cells, which are still virgin and can be employed as a reference for the sense amplifier when reading the dual array of memory cells. In FIG. 1 the right branch 2' operates as a reference branch, so that a virgin cell current Iv is flowing in the reference cell REF' belonging to the right array of memory cells 3'. Therefore, the selected cell contained in the left array of memory cells 3 is a standard memory cell C supplying a cell current Ic, even if the left array of memory cells 3 may also contain reference cells itself.

It will be appreciated that in order to provide a safe detection, the load circuit 6' comprises a MOS p-channel transistor M3', which is installed in parallel to the transistor M1' of which it has the same aspect ratio. The function of such a transistor M3' is to cause a loads unbalance in the read circuit of the memory cells 1, so that a current I will flow in the left branch 2, which is a half of a current I' flowing in the right branch 2', causing a further voltage unbalance on nodes D and D', i.e. on input terminals IN and IN' of the differential amplifier, so allowing for a correct data reading in the memory cell. The read circuit of memory cells 1 will thus set a current value in the reference branch, whose ratio with the array current is proportional to the loads ratio.

Such a circuit has the following drawbacks. First of all, a poor symmetry of the circuits connected to the input terminals of the sense amplifier. Symmetry condition is particularly important when using dynamic amplifiers with a latch structure. Moreover, the difference between current I and current I' can be at most half the current supplied by the reference branch.

Finally, said circuit has high implementation difficulties whenever an exchange should be made between the branch with the reference function and the branch with an array function.

It is also known to use a symmetric loads circuit instead of the loads unbalance method, as it provides for injection of an offset-current on the array branch through a proper current source. The injection node is usually the one on the bitline, between the selection circuit and bias circuit. However, such a circuit involving execution of current sources based on current mirrors placed at a certain distance from the bitlines will cause some difficulties in the bias diffusion of the bitline, which is particularly undesired as it damages a correct data reading, in particular for dynamic approaches. Moreover, introduction of an offset-current obviously involves a higher current consumption.

Finally, said circuit also has high implementation difficulties should it be desired to make an exchange between the branch with a reference function and the branch wit an array function.

OBJECT OF THE INVENTION

It is the object of the present invention to solve the above drawbacks and provide a data read circuit for non volatile memory cells organized in arrays, having a more efficient and improved performance.

In this frame, it is the main object of the present invention to provide a data read circuit for non volatile memory cells organized in arrays, which has a high degree of circuit symmetry and allows an easy exchange of the reference branch with the array branch.

A further object of the present invention is to provide a data read circuit for non volatile memory cells organized in arrays, wherein the difference between the current flowing in the array branch and the current flowing in the reference branch is greater than half the current flowing in the reference array.

A further object of the present invention is to provide a data read circuit for non volatile memory cells organized in arrays, which is capable of introducing a current gain for the difference between the current flowing in the array branch and the current flowing in the reference branch with respect to the cell current.

A further object of the present invention is to provide a data read circuit for non volatile memory cells organized in arrays, which does not jeopardize the bias of the bitlines.

A further object of the present invention is to provide a data read circuit for non volatile memory cells organized in arrays, which does not require higher current consumptions compared to common circuits.

In order to achieve such aims, it is the object of the present invention to provide a data read circuit for non volatile memory cells organized in arrays, incorporating the features of the annexed claims, which form an integral part of the description herein.

BRIEF DESCRIPTION OF THE DRAWINGS

Further objects, features and advantages of the present invention will become apparent from the following detailed description and annexed drawings, which are supplied by way of non limiting example, wherein.

SPECIFIC DESCRIPTION

Figure 2:
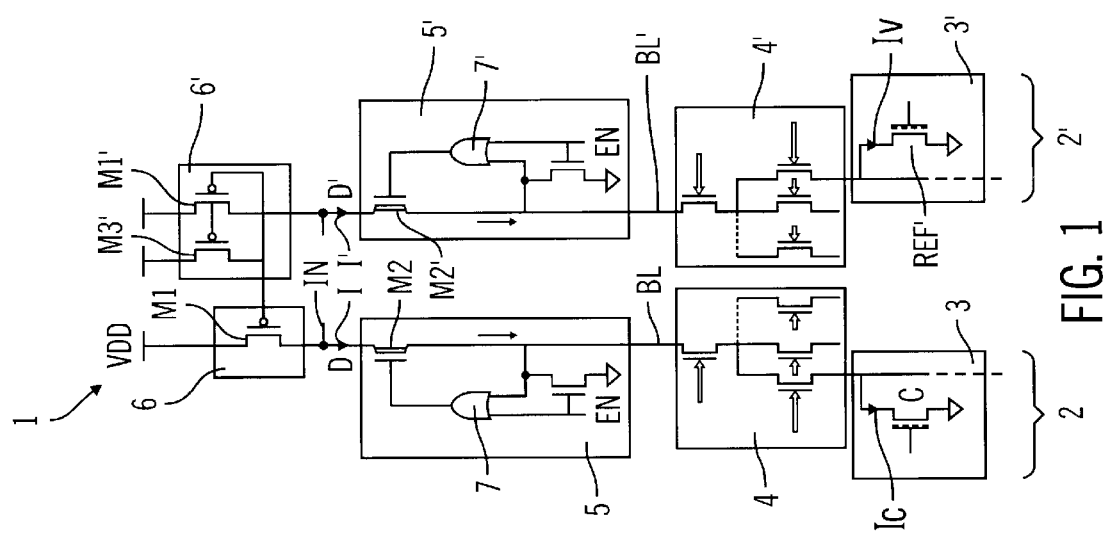
FIG. 2 shows a basic circuit diagram of a data read circuit in non volatile memory cells organized in arrays, according to the present invention.

FIG. 2 shows a basic diagram of a data read circuit in non volatile memory cells 11, according to the present invention. Said read circuit of memory cells 11 according to the present invention comprises a left branch 12 and a right branch 12', with corresponding left array of memory cells 13 and a right array of memory cells 13'. Selector circuits 14 and 14' as well as bias circuits 15 and 15' are then provided upstream. Finally, load circuits 16 and 16' are also provided, whose circuital implementation is not shown in detail since it is not binding for the purposes of the description contained herein.

In this instance the left array 12 is the array branch, whereas the right branch 12' is acting as a reference array. As a result, the bias circuit 15 differs from the bias circuit 15'. Said bias circuit 15' is obtained through an arrangement substantially similar to that of the bias circuit 5 or 5' of FIG. 1, i.e. it comprises a logical gate 17' and a pass transistor M12' in cascode configuration. The bias circuit 15 on the left branch 12, i.e. the array branch, also has a logical gate 17 and a pass transistor M12 in cascode configuration, but a second additional pass transistor M14 is provided, which is connected in parallel to the pass transistor M12 with respect to the node D, i.e. the gate electrode of the pass transistor M14 is connected to the logical gate output 17 and the source electrode to the node D, whereas the drain electrode is separated from the drain electrode of the pass transistor M12 by an insulating transistor M15 driven by a precharge signal PC, which is provided by a proper circuit not shown here as being commonly known On the contrary, the drain electrode of the pass transistor M12 is directly connected to the electrode of the pass transistor M12' belonging to the bias circuit 15' in the right branch 2.

The pass transistor 14 has an aspect ratio differing from the aspect ratio of pass transistors M12 and M12' due to a multiply factor k worth 0.5 for the circuit shown in FIG. 2.

Figure 1:
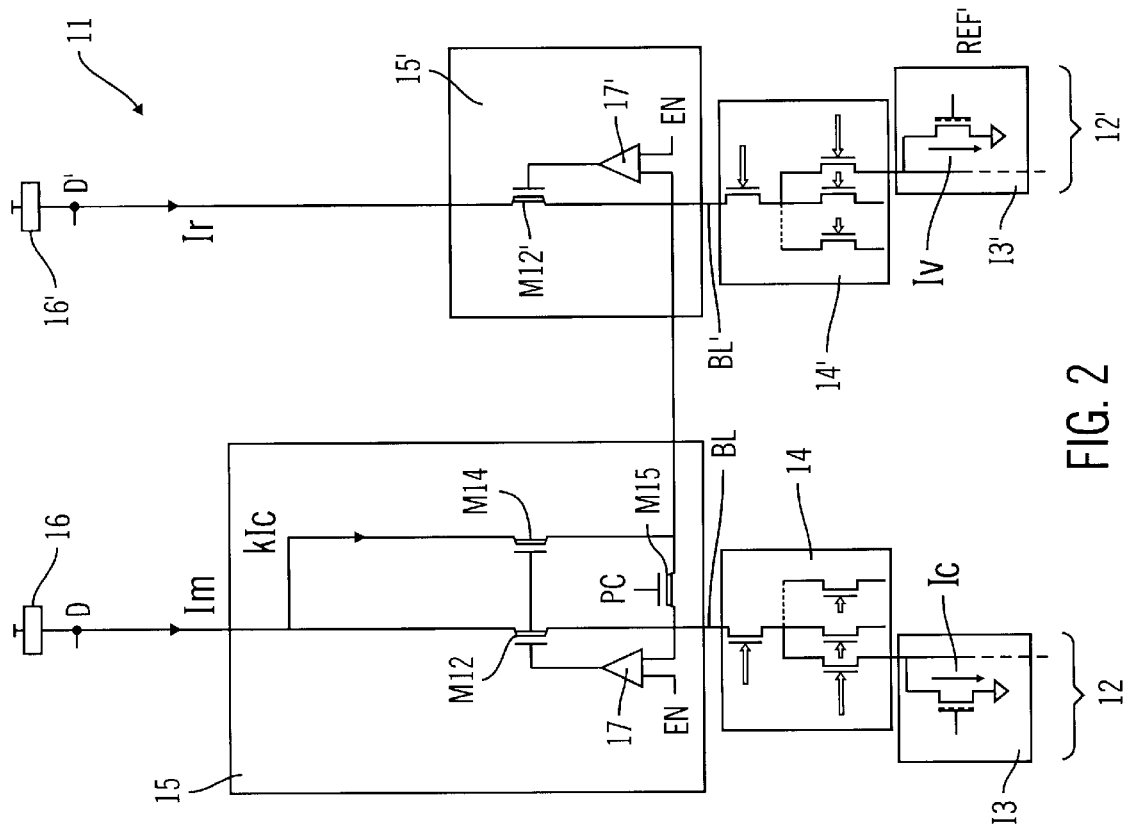
FIG. 1 shows a circuit diagram of a first data read circuit in non volatile memory cells organized in arrays, according to the known state of the art.

Let us define also in this case with Ic the cell current originated by a cell in the left cells array 13 and with Iv the current of a virgin cell, i.e. the current originated by a virgin reference cell REF' contained in the right cells array 13', with Im an array current corresponding to the current I of FIG. 1 flowing in the left branch 12 and with Ir a reference current corresponding to the current I' of FIG. 1, flowing in the right branch 12'.

Thus, during read operation, i.e. when the precharge signal PC is at a low level and inhibits the insulating transistor M15, the current of cell Ic flows through the pass transistor M12, whereas a fraction k of the cell current Ic, i.e. kIc, flows through the second pass transistor M14. As a result, in this case the array current Im is worth (1+k)Ic.

Moreover, the current $kIc$ flowing through the second pass transistor M14 is injected in the right branch 12', so that the reference current Ir will be Iv-kIc. During the precharge step the precharge signal PC takes a high logic status bringing the insulating transistor M15 in conduction and allowing an equalized precharge of both bitlines BL and BL'.

Therefore, it is obvious that the use of the second pass transistor M14 leads to a current unbalance on load circuits 16 and 16', without operating on said load circuits 16 and 16', but rather through a current redistribution in pass transistors M12, M12' and M14.

Figure 2B:
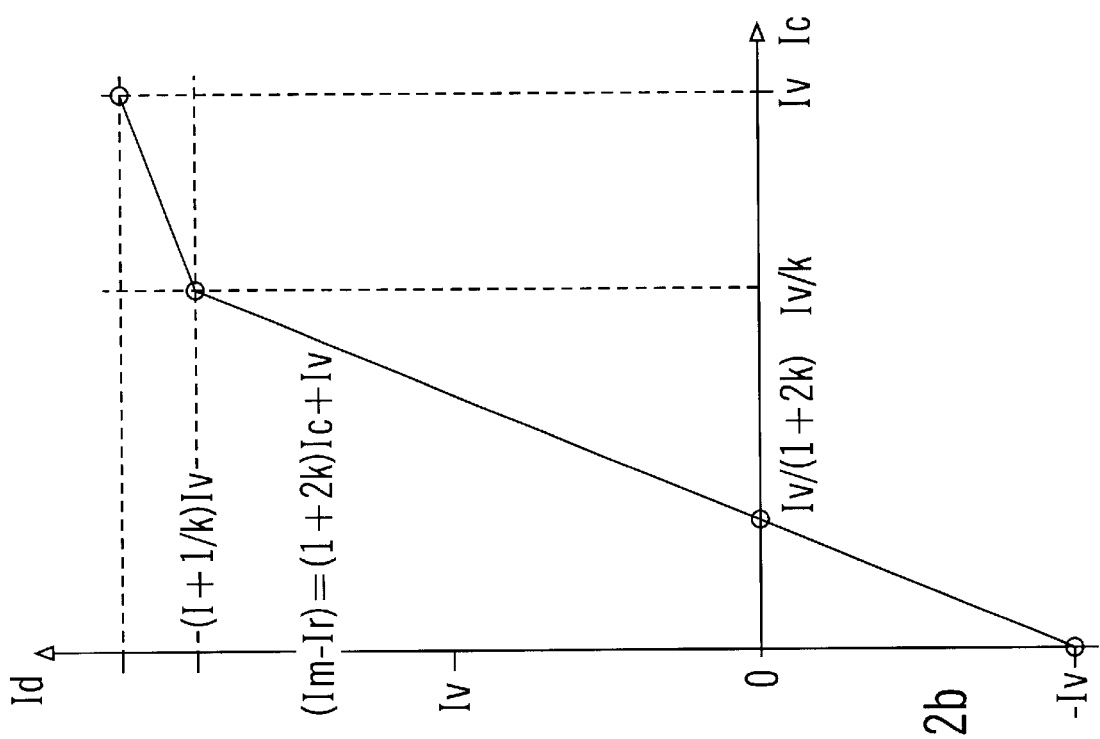
FIGS. 2a and 2b show diagrams related to the currents of the data read circuit in non volatile memory cells organized in arrays, as represented in FIG. 2.
Figure 2A:
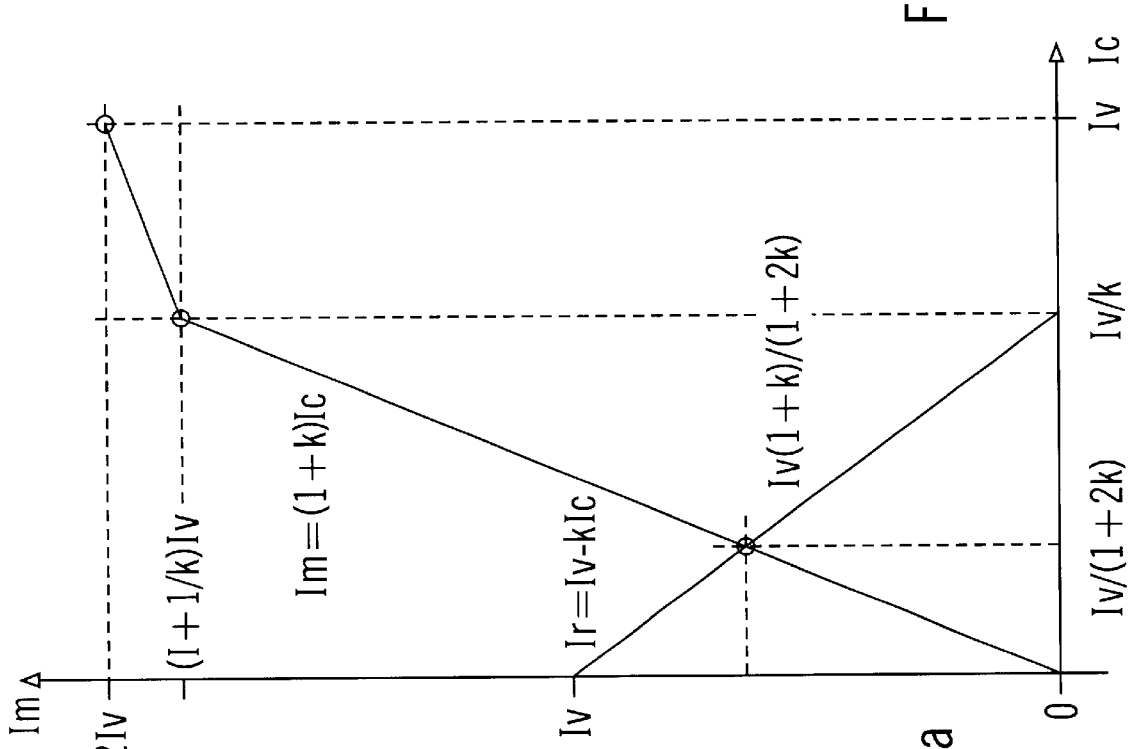

A discussion is following of the currents flowing in the read circuit of memory cells 11 to highlight all further features of said read circuit of memory cells 11 according to the present invention. Reference is also made to the diagrams reported in FIG. 2a and FIG. 2b showing the array current Im as a function of the cell current Ic and a vector of current difference Id, corresponding to Im-Ir, always as a function of the cell current Ic.

Let us consider the read circuit of memory cells 11 with the precharge signal PC at its low level, i.e. during a read step. This event causes a current paths change altering the initial symmetry of the current flows, which are redistributed complying with the following equations:

| | | | |
|---|---|---|---|
| Im = Ic (1 + k) | Ir = Iv− | if: Ic < Iv/k | (linearity state) |
| Im = Ic + Iv | Ir = 0 | if: Ic > Iv/k | (saturation state) |

From the system equations it can be assumed:
a) Original condition
   for Ic=0 we have Ir=Iv
b) Balance condition
   for Im=Ir we have Ic(I+k)=Iv−kIc and Ic=v(1+k)/(1+2 k)
c) Saturation condition
   for Ir=0 and kIc=Iv we have Ic=Iv/k
d) Array current value at saturation point:
   if Im=(1+k)Ic then we have Im=(1+1/k)Iv.
   Since Ir=Iv−kIc, as a result: Ir=0.
e) Vector of maximum array current Im:
   Ic=Iv
   kIc=Iv
   Im=Ic+Ic→Im=2Iv
f) Vector of current difference Id:
   Id=Im−Ir=(Ic+kIc)−(Iv−kIc)Im−Ir=(1+2 k)Ic−Iv
g) Derived with respect to the current of the "difference vector" cell:
   dId/dIc=d(Im−Ir)/dIc=d[(1+2 k)Ic−Iv]/dIc, therefore d(Im−Ir)/dIc=(1+2 k).

An interesting consideration arises from the last equation: Since the quantity (1+2 k) is always greater than 1, the change of the array current Im will always be greater than the change of the cell current Ic.

Therefore there is a gain effect of the changement of the array current Im compared to the change of the cell current Ic introduced by the special currents redistribution of the read circuit of memory cells 11. This behaviour can be described and quantified by introducing a gain A:

A=(1+2 k).

As to the previous points, it is possible to explain the equation values when the multiply factor is worth 0.5. The following results are reached for each condition:

| | | |
|---|---|---|
| a) | Ic = 0   Ir = Iv | Ic = 0   Ir = Iv |
| b) | Im = Ir = (3(4)Iv | Im = Ir = (2/3)Iv |
| c) | no saturation | Ic = Iv |
| d) | no saturation | Im = 2Iv   Ir = 0 |
| e) | Im = (3.12)Iv | Im = 2Iv |
| f) | −Iv  (Ic = 0); Iv (Ic = Iv) | −Iv (Ic = 0)   2Iv (Ic = Iv) |
| g) | A = 2 | A = 3 |

Figures 3, 4:
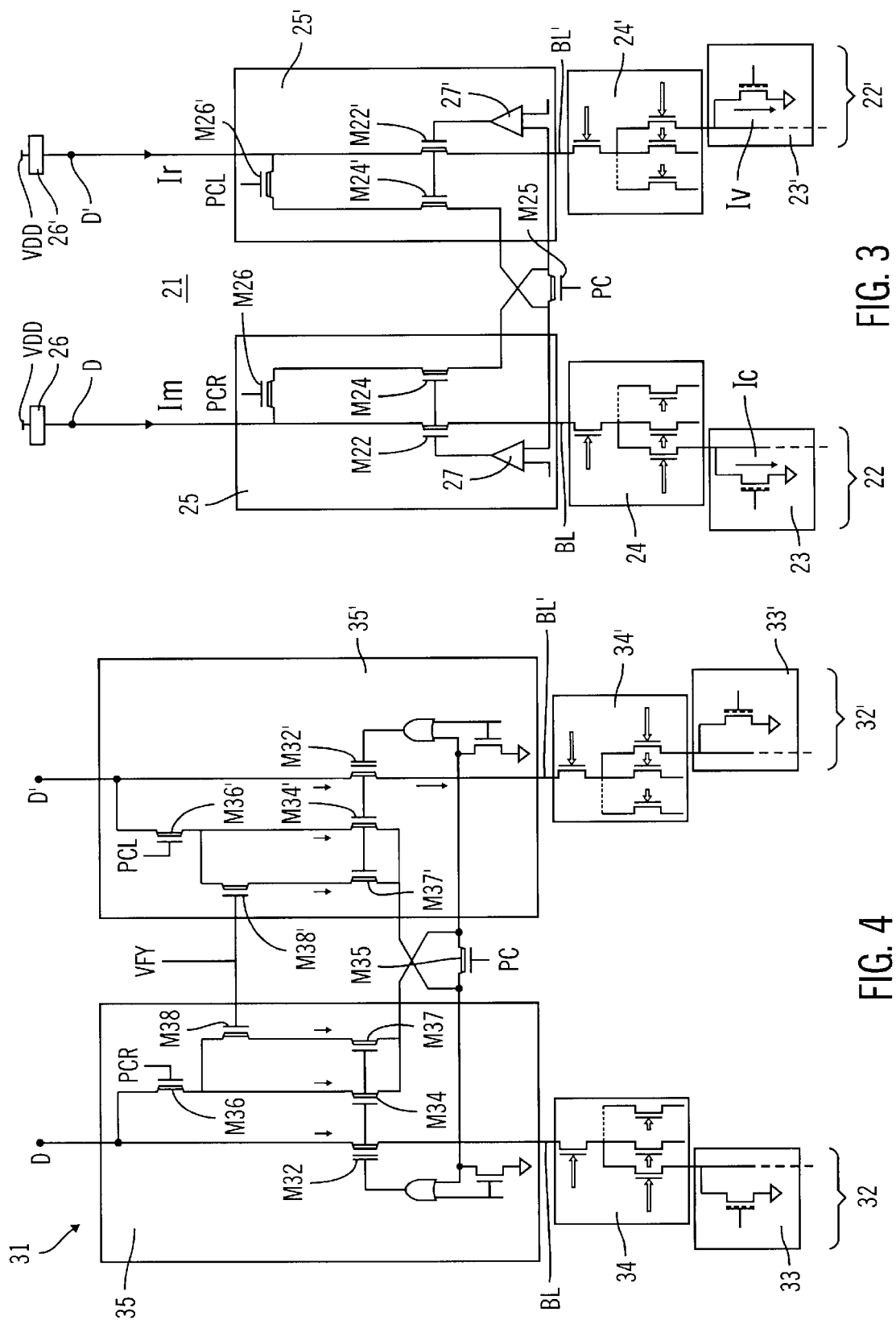
FIG. 3 shows a circuit diagram of a second embodiment of a data read circuit in non volatile memory cells organized in arrays, according to the present invention.
FIG. 4 shows a circuit diagram of a third embodiment of a data read circuit in non volatile memory cells organized in arrays, according to the present invention.

FIG. 3 shows a read circuit for memory cells 21 allowing exchange of the reference branch function between a left branch 22 and a right branch 22'. Therefore it has a bias circuit 25 and a bias circuit 25', which are fully symmetric. The bias circuit 25 comprises for instance a logical gate 27 and a pass transistor M22 in cascode configuration, as well as a second pass transistor M24 in parallel with the pass transistor M22 and with the drain electrode connected to the bitline BL' and to the insulating transistor M25 separating it from the bitline BL. An insulating transistor M26 controlled by a left precharge signal PCL separates the source electrode from the node D. Similarly, the bias circuit 25' comprises an insulating transistor M26' controlled by a right precharge signal PCR.

Operation of the read circuit of memory cells 21 is clear, bearing in mind that during each precharge step all precharge signals PC, PCL and PCR are at a high logic level. Each precharge step terminates with the descent to the low logic level of the precharge signal PC, as well as of the left precharge signal PCL provided the left branch 22 is carrying out the function as a reference branch Thus, the insulating transistor M26 is inhibited and operation of the pass transistor M24 disabled. As a result, the path between the node D and the bitline BL' is interrupted, whereas the path between the node D' and the bitline BL will not be interrupted. Viceversa, the right precharge signal PCR will follow the trend of the precharge signal PC using the right branch 22' as a reference branch.

FIG. 4 shows a read circuit for memory cells 31 comprising a verify function. Such a verify function, i.e. introducing a further current margin between the reference branch and array branch, is not usually available to the user, but is employed for controlling a correct data reading in the cells with a higher unbalance margin than usual.

The read circuit for memory cells 31 is substantially similar to the read circuit of memory cells 21, with the addition of third pass transistors M37 and M37' in parallel with second pass transistors M34 and M34', which have their same aspect ratio identified by the multiply factor k in bias circuits 35 and 35' related to a left branch 32 and a right branch 32'. The third pass transistor M37, for instance, has its drain electrode in common with the second pass transistor M34, whereas the source electrode of the third pass transistor M37 is separated from the source electrode of the second pass transistor M37 by an insulating transistor M38. An analogous structure is replicated for the bias circuit 35' related to the right branch 32, with implementation of a third pass transistor M37' and an insulating transistor M38'. Insulating transistors M38 and M38' have their gate electrodes in common receiving a verify signal VFY, which is apt to enable the verify step when at its high logic level. In fact, when the verify signal VFY reaches such a value the insulating transistor s M38 and M38' become conducting and enable paths operation through third pass transistors M37 and M37'.

The second transistor M34 and third pass transistor M37, for instance, will be equal to one sole equivalent pass transistor, whose multiply factor k is worth 1.

Therefore, with reference to FIGS. 2a, 2b and operating conditions from a) to g) previously mentioned it will be:

| | | |
|---|---|---|
| a) | Ic = 0 Ir = Iv | |
| b) | Im = Ir = (2/3)Iv | |
| c) | Ic = Iv | |
| d) | Im = 2Iv Ir = 0 | |
| e) | Im = 2Iv | |
| f) | –Iv (Ic = 0) | 2Iv (Ic = Iv) |
| g) | A = 3 | |

It should also be noticed that during the precharge steps the verify signal VFY is at its high logic level, the same as for the left precharge signals PCL and right precharge signals PCR. As a result, the verify signal VFY will retain an additional current path through third pass transistors M37 and M37', so as to allow a faster precharge.

Figure 5:
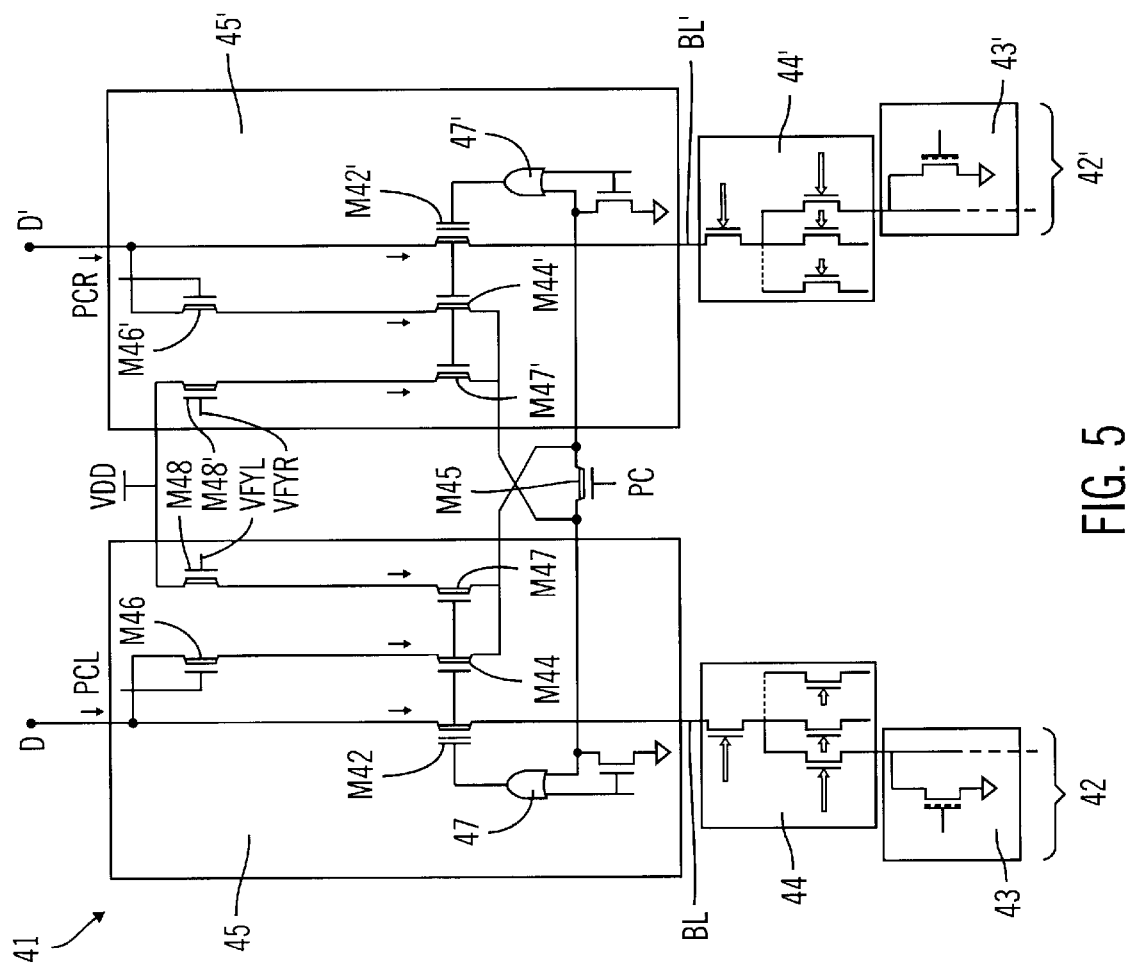
FIG. 5 shows a circuit diagram of a fourth embodiment of a data read circuit in non volatile memory cells organized in arrays, according to the present invention.

FIG. 5 shows a further embodiment of a read circuit for memory cells 41, i.e. either a left branch 42 or a right branch 42' only will be enabled for operation with margin. Therefore, third pass transistors M47 and M47' are provided, whose drain electrode is in common with the drain electrode of second pass transistors M44 and M44' as for the read circuit of memory cells 21 and 31, whereas the source electrode is connected to a supply voltage VDD through relevant insulating transistor s M48 and M48'. Said insulating transistors M48 and M48' are driven by their relevant left verify signals VFYL and right verify signals VFYR.

During precharge steps said left verify signals VFYL and right verify signals VFYR are maintained at their high logic level, so that they substantially provide for connection with the supply voltage VDD for bitlines BL and BL', allowing a particularly fast and efficient precharge.

Figure 6B:
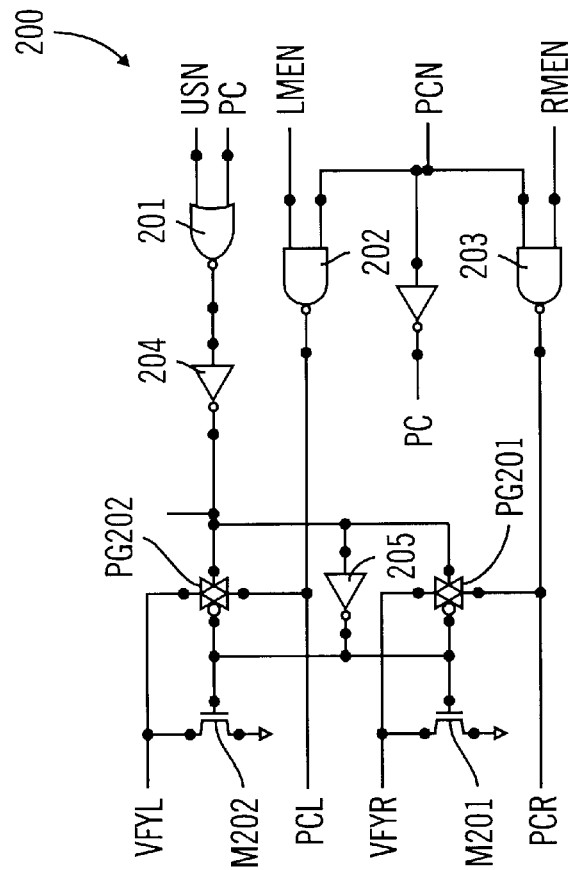
FIG. 6b shows a circuit diagram of a drive circuit apt to cooperate with the data read circuit in non volatile memory cells organized in arrays, as represented in FIG. 5.
Figure 6A:
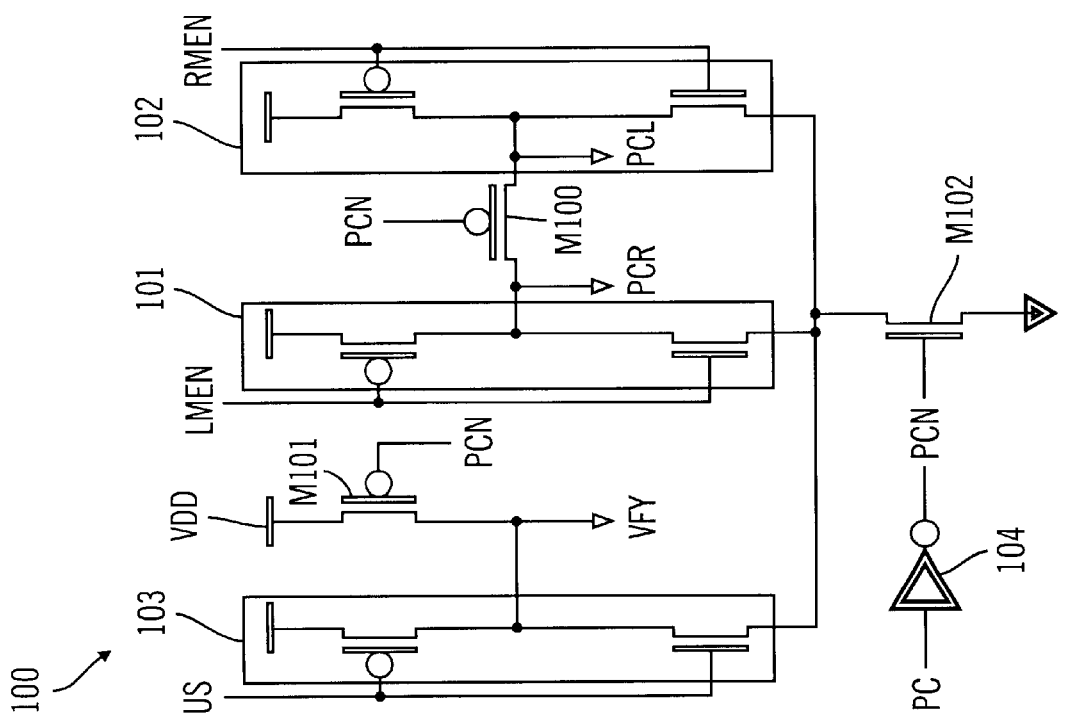
FIG. 6a shows a circuit diagram of a drive circuit apt to cooperate with the data read circuit in non volatile memory cells organized in arrays, as represented in FIG. 4.

FIG. 6a shows a signals generating logic circuit 100 apt to cooperate with the circuit 31 of FIG. 4. Said signals generating logic circuit 100 will supply the left precharge signal PCL, right precharge signal PCR and verify signal VFY upon receiving the precharge signal PC and a complementary precharge signal of its own, a user mode signal US, an enable signal of the left array RMEN and an enable signal of the right array LMEN.

The enable signal of the right array LMEN reaches the input of an inverter circuit 101 where the right precharge signal PCR is picked up at its output. The enable signal of the left array RMEN reaches the input of an inverter circuit 102 where the left precharge signal PCL is picked up at its output. A MOS p-channel transistor M100 driven by the complementary precharge signal PCN will connect both inverter circuits outputs 101 and 102.

An inverter circuit 103 receives at its input the user mode signal US and will produce at its output the verify signal VFY, which is naturally its complementary signal. A MOS p-channel pull-up transistor M101 driven by the complementary precharge signal PCN will let the verify signal VFY reach its high logic level during precharge steps.

All three inverter circuits 101, 102, 103 are connected to ground through a MOS n-channel transistor M102, which is driven by the precharge signal PC, inverted through a fourth inverter circuit 104. When the precharge signal PC is at its high logic state, i.e. a precharge step is in course, the transistor M102 is inhibited and hinders operation of inverter circuits 101, 102 and 103. The pull-up transistor M102 becomes conducting and sets a high logic state for the verify signal VFY to allow a faster precharge step as previously seen. The transistor M101 becomes conducting, so that both the left and right precharge signals PCL and PCR are at their high logic state, independently from whichever enable signal of the left array RMEN or right array LMEN is at its low logic state, thus permitting a fast equalized precharge.

When the precharge signal PC is at its low logic state, the transistor M103 becomes conducting, pull-up transistor M102 and transistor M101 are inhibited, so that only inverter circuits 101, 102 and 103 are activated and supply verify signals VFY, left precharge signals PCL and right precharge signals PCR, which are inverted with respect to user mode signals US, to enable signals of the left array RMEN and enable signals of the right array LMEN. FIG. 6b shows a signals generating logic circuit 200, which is apt to cooperate with the circuit 41 represented in FIG. 5.

Said signals generating logic circuit 200 supplies the left precharge signal PCL, right precharge signal PCR, left verify signal VFYL, right verify signal VFYR upon receiving the precharge signal PC, of its complementary precharge signal PCN, a complemented user mode signal USN, an enable signal of the left array RMEN and enable signal of the right array LMEN.

The user complemented mode signal USN is sent with the precharge signal PC at the input of a NOR logical gate 201. The complementary precharge signal PCN reaches the input in parallel with two NAND logical gates 202 and 203, which will receive at the other input the enable signal of the left array RMEN and the enable signal of the right array LMEN, respectively. At the output of said logical gates 202 and 203 both the right precharge signal PCR and left precharge signal PCL are picked up, respectively.

The left verify signal VFYL is derived from the left precharge signal PCL through a passgate transistor PG201, the right verify signal VFYR is derived from the right precharge signal PCR through a passgate transistor PG202. The non inverting input of said transistors PG201 and PG202 is controlled by the inverted output through an inverter 204 of the logical gate 201, whereas a further inverter 205 in series with the inverter 204 supplies the signal for the inverting input of said transistors PG201 and PG202.

During the precharge step, i.e. when the precharge signal PC is at its high level the logical gate 201—which is a NOR port—is always at its low logic level, so that transistors PG201 and PG202 become conducting and logical gates 202 and 203—which are NAND ports—supply a high logic level at the output, which is taken by the left precharge signals PCL, right precharge signal PCR, left verify signal VFYL and right verify signal VFYR.

During the evaluation step the precharge signal PC goes to its low level; thus logical gates 202 and 203 will have a high logic level output only if the enable signal of the left array RMEN or right array LMEN is low.

The logical gate 201 has a high logic level output only if the user complementary mode signal USN is low. Under this condition both transistors P201 and P202 are inhibited and the left verify signal VFYL and right verify signal VFYR are brought to ground by their relevant MOS n-channel pull-down transistors M201 and M202 controlled by the inverter output 205.

From the above description the features of the present invention are clear and also its advantages will be clear.

Advantageously, the data read circuit of non volatile memory cells organized in arrays according to the present invention has a high circuit symmetry degree for easy exchange of the reference branch with the array branch, so it can be used in such structures where the reference cells are included in memory arrays.

The data read circuit of non volatile memory cells organized in arrays according to the present invention does not require additional currents, such as offset currents, nor the use of current mirrors causing propagation problems. At the same time, through the data read circuit of non volatile memory cells organized in arrays the difference between the current flowing in the array branch and the current flowing in the reference branch may be higher than half the current flowing in the reference branch, thus differing from common circuits.

Moreover, as a response to an input current change there will be a change with a current gain to the loads. Said advantages are also noticeable in the verify functions.

Finally, the data read circuit of non volatile memory cells organized in arrays will advantageously allow the use of the circuit arrangement for unbalancing the loads also to favour the precharge step, thus allowing a higher current flow to the bitlines, in particular with direct supply paths.

All above mentioned advantages are obtained through a current unbalance system in the loads based on redistribution of the currents flowing in the pass transistors controlled by the cascodes, in particular through current injection from one branch to the other.

It is obvious that many changes are possible for the man skilled in the art to the data read circuit of non volatile memory cells organized in arrays described above by way of example, without departing from the novelty spirit of the innovative idea, and it is also clear that in practical actuation of the invention the components may often differ in form and size from the ones described and be replaced with technical equivalent elements.

What is claimed is:

1. A data read circuit for non volatile memory cells, said data read circuit comprising:

an array branch comprising an array bitline leading to a read cell apt to provide a cell current, a bias circuit for said array bitline, and a load circuit wherein is flowing an array current;

a reference branch including a reference bitline leading to a reference cell apt to provide a virgin cell current, a bias circuit of said reference bitline, and a load circuit wherein is flowing a reference current; and means for unbalancing the array current with respect to the reference current, said means for unbalancing the array current with respect to the reference current providing a current redistribution path that injects a fraction of the array current from the array branch to the reference branch.

2. A data read circuit for non volatile memory cells according to claim 1, wherein said unbalancing means are comprised in the bias circuit of the array branch and the bias circuit of the reference branch, not in the load circuit of the array branch and the load circuit of the reference branch.

3. A data read circuit for non volatile memory cells according to claim 2, wherein the bias circuit of the array branch includes a first pass transistor, the bias circuit of the reference branch includes a second pass transistor, and said unbalancing means includes at least one additional pass transistor.

4. A data read circuit for non volatile memory cells according to claim 3, wherein when conducting, said at least one additional pass transistor determines a current path between the load circuit of the array branch and the bitline of the reference branch.

5. A data read circuit for non volatile memory cells according to claim 4, wherein at least one additional pass transistor is included both in the bias circuit of the array branch and the bias circuit of the reference branch.

6. A data read circuit for non volatile memory cells according to claim 5, wherein each of the bias circuits comprise selector circuits controlled by precharge signals apt to inhibit operation of the at least one additional pass transistor of the bias circuit of the array branch or the bias circuit of reference branch for the purposes of function exchange between said branches.

7. A data read circuit for non volatile memory cells according to claim 6, wherein the bias circuit of the array branch and the bias circuit of the reference branch both include first and second additional pass transistors with selector circuits controlled by verify signals, said selector circuits being apt to place the second additional pass transistors in parallel with the first additional pass transistors, so as to increase the fraction of the array current that is injected in the reference branch.

8. A data read circuit for non volatile memory cells according to claim 7, wherein said selector circuits receive one verify signal for enabling operation of the second additional pass transistors.

9. A data read circuit for non volatile memory cells according to claim 7, wherein said selector circuits receive a left verify signal and a right verify signal for selectively enabling operation of the second additional pass transistors.

10. A data read circuit for non volatile memory cells according to claim 9, wherein one of said selector circuits and one of said second additional pass transistors is interposed between each of the bitlines and the supply voltage.

11. A data read circuit for non volatile memory cells according to claim 3, wherein during reading, said first and second pass transistors are controlled through a fixed bias voltage.

12. A data read circuit for non volatile memory cells according to claim 6, wherein the precharge signals are obtained through a logic circuit from enable signals.

13. A data read circuit for non volatile memory cells according to claim 12, wherein said logic circuit further obtains verify signals from a user mode signal.

14. An unbalancing method of the current flowing in an array branch with respect to the current flowing in a reference branch during read operations in data read circuits for non volatile memory cells, said method comprising the step of:

providing a current redistribution path from the array branch to the reference branch; and during a read operation using the current redistribution path to inject a fraction of the current flowing in the array branch to the reference branch.

15. An unbalancing method of the current flowing in an array branch with respect to the current flowing in a reference branch according to claim 14, wherein the current redistribution path is also used during precharging of bitlines of the array branch and reference branch.

16. An unbalancing method of the current flowing in an array branch with respect to the current flowing in a reference branch according to claim 14, further comprising the step of selectively increasing the current injected in the reference branch during the read operation to execute a verify function.

17. An unbalancing method of the current flowing in an array branch with respect to the current flowing in a reference branch according to claim 16, wherein the current is increased by injecting a larger fraction of the current flowing in the array branch.

18. An unbalancing method of the current flowing in an array branch with respect to the current flowing in a reference branch according to claim 16, wherein the current is increased by injecting current from a supply voltage.

* * * * *